(12) United States Patent
Shen et al.

(10) Patent No.: US 7,612,418 B2
(45) Date of Patent: Nov. 3, 2009

(54) MONOLITHIC POWER SEMICONDUCTOR STRUCTURES INCLUDING PAIRS OF INTEGRATED DEVICES

(75) Inventors: Zheng Shen, Oviedo, FL (US); David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 0 days.

(21) Appl. No.: 10/582,035

(22) PCT Filed: Dec. 10, 2004

(86) PCT No.: PCT/US2004/041243

§ 371 (c)(1),
(2), (4) Date: May 7, 2007

(87) PCT Pub. No.: WO2005/059958

PCT Pub. Date: Jun. 30, 2005

(65) Prior Publication Data

US 2007/0278597 A1    Dec. 6, 2007

Related U.S. Application Data

(60) Provisional application No. 60/529,340, filed on Dec. 12, 2003, provisional application No. 60/542,434, filed on Feb. 5, 2004.

(51) Int. Cl.
*H01L 27/088* (2006.01)
(52) U.S. Cl. .............. 257/401; 257/658; 257/E25.016; 257/E25.026

(58) Field of Classification Search ............... 257/361, 257/391, 392, 401, 369, 119, 658, E25.016, 257/E25.026
See application file for complete search history.

(56) References Cited

U.S. PATENT DOCUMENTS

| | | | |
|---|---|---|---|
| 4,199,774 A |  | 4/1980 | Plummer |
| 4,472,871 A | * | 9/1984 | Green et al. ................ 438/276 |
| 4,574,209 A |  | 3/1986 | Lade et al. |
| 4,656,493 A | * | 4/1987 | Adler et al. ................. 257/376 |
| 5,119,159 A |  | 6/1992 | Hoshi et al. |
| 5,192,989 A |  | 3/1993 | Matsushita et al. |
| 5,381,025 A |  | 1/1995 | Zommer |
| 5,389,810 A | * | 2/1995 | Agata et al. ................. 257/369 |
| 5,539,238 A |  | 7/1996 | Malhi |
| 5,723,891 A |  | 3/1998 | Malhi |
| 5,910,664 A |  | 6/1999 | Ajit |

(Continued)

FOREIGN PATENT DOCUMENTS

WO    WO 2004/034432    4/2004

OTHER PUBLICATIONS

International Search Report for PCT/US04/041243, dated Dec. 13, 2005 (3 pgs.).

(Continued)

*Primary Examiner*—Lex Malsawma
*Assistant Examiner*—Robert Huber
(74) *Attorney, Agent, or Firm*—Goodwin Procter LLP

(57) ABSTRACT

Monolithic semiconductor structures having at least two pairs of two lateral semiconductor devices combined on a first surface of a single semiconductor substrate. Embodiments include connected source terminals defining common source terminals.

9 Claims, 11 Drawing Sheets

FIRST EMBODIMENT: 3-LEAD SELF-DRIVEN SYNCHRONOUS RECTIFICATION MOSFET PAIR

FIRST EMBODIMENT: 3-LEAD SELF-DRIVEN MOSFET PAIR IN INTERLEAVED CELL FINGERS

U.S. PATENT DOCUMENTS

| | | | |
|---|---|---|---|
| 6,261,944 B1* | 7/2001 | Mehta et al. | 438/624 |
| 6,455,905 B1* | 9/2002 | Perugupalli et al. | 257/393 |
| 6,507,070 B1 | 1/2003 | Shen et al. | |
| 6,683,380 B2 | 1/2004 | Efland et al. | |
| 6,710,441 B2 | 3/2004 | Eden et al. | |
| 6,958,514 B2 | 10/2005 | Nakayama et al. | |
| 2002/0008549 A1* | 1/2002 | Forbes | 327/57 |
| 2002/0093062 A1 | 7/2002 | Eden et al. | |
| 2002/0175373 A1* | 11/2002 | Utsunomiya et al. | 257/347 |
| 2004/0164350 A1 | 8/2004 | Kawaguchi et al. | |

OTHER PUBLICATIONS

Written Opinion of the International Searching Authority for PCT/US04/041243, dated Dec. 13, 2005 (5 pgs.).

International Preliminary Report on Patentability for PCT/US04/41243, completed Apr. 18, 2008, 4 pages.

International Search Report for PCT/US04/03051, dated Aug. 2, 2005, 2 pages.

Office Action for Chinese Application No. 200480001444.1, issued Dec. 7, 2007.

Darwish, et al., "Scaling Issues in Lateral Power MOSFETS," Proc. 1998 Intl. Symp. on Power Semiconductor Devices & ICs, pp. 329-332.

Shen et al., "Lateral Discrete Power MOSFET: Enabling Technology for Next-Generation, MHz-Frequency, High-Density DC/DC Converters," APEC (2004).

Sun et al., "0.35 µm, 43 µΩcm$^2$ 6mΩ Power MOSFET to Power Future Microprocessor," IEEE pp. 77-79 (1999).

Pavier et al., "Bi-directional FlipFET™ MOSFETs for Cell Phone Battery Protection Circuits," PCIM 2001.

* cited by examiner

SECOND EMBODIMENT:
5-LEAD CONTROL IC-DRIVEN
SYNCHRONOUS RECTIFICATION
MOSFET PAIR

FIRST EMBODIMENT:
3-LEAD SELF-DRIVEN
SYNCHRONOUS RECTIFICATION
MOSFET PAIR

FIRST EMBODIMENT: 3-LEAD SELF-DRIVEN MOSFET PAIR IN INTERLEAVED CELL FINGERS

SECOND EMBODIMENT: 5-LEAD EXTERNAL-DRIVEN MOSFET PAIR IN INTERLEAVED CELL FINGERS

THIRD EMBODIMENT: 3-LEAD SELF-DRIVEN MOSFET PAIR IN SEPARATE CELL SECTIONS

FOURTH EMBODIMENT: 5-LEAD EXTERNAL-DRIVEN MOSFET PAIR IN SEPARATE CELL SECTIONS

CROSS-SECTIONAL DIAGRAM OF A POWER MOSFET WITH INTEGRATED DRAIN SENSE

CROSS-SECTIONAL DIAGRAM OF A POWER MOSFET WITH INTEGRATED DRAIN SENSE

CROSS-SECTIONAL DIAGRAM OF A POWER MOSFET WITH INTEGRATED DRAIN SENSE

MONOLITHIC POWER SEMICONDUCTOR STRUCTURES INCLUDING PAIRS OF INTEGRATED DEVICES

CROSS-REFERENCE TO RELATED APPLICATIONS

This application is the U.S. national stage application of International (PCT) Patent Application Serial No. PCT/US04/41243, filed Dec. 10, 2004, which claims the benefit of priority to U.S. Application Nos. 60/529,340, filed Dec. 12, 2003, and 60/542,434, filed Feb. 5, 2004. The entire disclosures of these three applications are hereby incorporated by reference in their entirety.

STATEMENT REGARDING FEDERALLY SPONSORED RESEARCH OR DEVELOPMENT

Not applicable

REFERENCE OF A "MICROFICHE APPENDIX"

Not applicable

BACKGROUND OF THE INVENTION

1. Field of Invention

The present invention relates, in general, to semiconductors and, more particularly, to a novel monolithic semiconductor structure having one or more pairs of semiconductor devices combined on a semiconductor substrate.

2. Brief Description of the Prior Art

As the operating voltage of microprocessors approaches the one-volt mark, operating currents continue to increase. Today's high-end notebook computers consume 20 A. Servers and high-end desktop computers presently require 60 to 90 A. The next-generation GHz class of microprocessors will require current as high as 130 A. These changes in operating conditions challenge power components to maintain and monitor acceptable efficiency levels.

Power components may use isolated forward converters to maintain acceptable efficiency levels and reduce power dissipation. A common isolated forward converter topology for the computer, telecom and networking industry has one discrete vertical planar or trench MOSFET on the primary side and two discrete vertical planar or trench MOSFETs on the secondary side as synchronous rectifiers.

FIG. 1A-B depict aspects of prior art synchronous rectifier circuits. Specifically, FIG. 1A is a schematic of a prior art self-driven synchronous rectifier using three discrete trench MOSFETs, M1, M2 and M3. Alternatively, FIG. 1B is a schematic diagram of an external-driven synchronous rectifier using three discrete trench MOSFETs, M1, M2 and M3. In both topologies, M1 functions as a primary-side control switch, M2 functions as a secondary-side synchronous forward and M3 functions as a secondary-side synchronous catch.

International Rectifier's 30V-rated IRF7822 or IRF6603 (DirectFETTM) products are examples of widely used devices using discrete vertical planar or trench MOSFETs in rectification applications.

Power components may also use two discrete vertical planar or trench MOSFETs to monitor operating conditions—one vertical planar or trench MOSFET functions as a main switch with its current monitored by a second ("external") vertical planar or trench MOSFET which functions as a sense. FIG. 2 is a schematic diagram illustrating the foregoing prior art configuration. As shown, the source and gate terminals of the power MOSFET switch are connected to the corresponding source and gate terminals of the external MOSFET sense. The drain terminal of the external MOSFET sense monitors the voltage or current at the drain of the MOSFET switch.

Both low device on-resistance and low gate charge are necessary to run high-frequency forward converters or increase power density in the same form-factor. Vertical planar or trench MOSFETs exhibit very low on-resistance but have a high gate charge due to the inherent vertical device structures.

Moreover to greatly reduce parts count, PCB space, and interconnect parasitics, it is desirable to combine secondary side MOSFETs or switch and sense MOSFETs on a single substrate However, because vertical planar and trench MOSFETs have a common backside drain terminal, it is very complicated and expensive to combine two vertical planar or trench MOSFETs on a single semiconductor substrate.

On the other hand, lateral power MOSFETs, that until now are exclusively used in power ICs and as discrete RF devices, offer very low gate charge and reasonably low on-resistance. However, the use of lateral power MOSFETs is limited to small chip sizes and current ratings due to high metal interconnect parasitic resistance.

SUMMARY OF THE INVENTION

The present invention addresses the aforementioned limitations of the prior art by providing, in accordance with one aspect of the present invention, a monolithic semiconductor structure or device having at least two lateral power transistor devices combined on a single semiconductor substrate.

In accordance with a second aspect of the present invention, there is provided a monolithic self-driven synchronous rectifier structure comprising a pair of lateral power MOSFETs combined on a single semiconductor substrate.

In accordance with a third aspect of the present invention, there is a provided a monolithic external-driven synchronous rectifier structure comprising a pair of lateral power MOSFETs combined on a single semiconductor substrate.

In accordance with additional aspects of the present invention, there is provided exemplary embodiments of monolithic structures having an integrated drain sense and comprising at least two lateral power MOSFETs combined on a single semiconductor substrate.

These and other aspects, features and advantages of the present invention will become better understood with regard to the following description, appended claims, and accompanying drawings.

BRIEF DESCRIPTION OF THE DRAWINGS

Exemplary embodiments of the present invention are now briefly described with reference to the following drawings.

DESCRIPTION OF THE INVENTION

The aspects, features and advantages of the present invention will become better understood with regard to the following description with reference to the accompanying drawings. What follows are preferred embodiments of the present invention. It should be apparent to those skilled in the art that the foregoing is illustrative only and not limiting, having been presented by way of example only. All the features disclosed in this description may be replaced by alternative features serving the same purpose, and equivalents or similar purpose, unless expressly stated otherwise. Therefore, numerous other embodiments of the modifications thereof are contemplated as falling within the scope of the present invention as defined herein and equivalents thereto.

Because of the common backside drain terminal, current vertical planar and trench power MOSFET devices are very difficult and expensive to combine on a single semiconductor substrate to create a monolithic semiconductor structure. However, provided herein are exemplary embodiments of novel monolithic semiconductor structures having at least one first lateral semiconductor device combined with at least one second lateral semiconductor device on a single semiconductor substrate. Each of the lateral semiconductor devices is constructed such that source, drain and gate terminals terminate on the top surface of the device. A suitable example of such a lateral semiconductor device is a conventional lateral power MOSFET. Another suitable example, is a novel power semiconductor device described in Applicant's International Application No. PCT/US2003/031603, entitled "Power MOSFET," the disclosure of which is incorporated by reference in its entirety herein. The monolithic structures provided herein are fabricated by conventional methods.

Monolithic Synchronous Rectifiers

FIG. 3

Figures 1A, 1B:
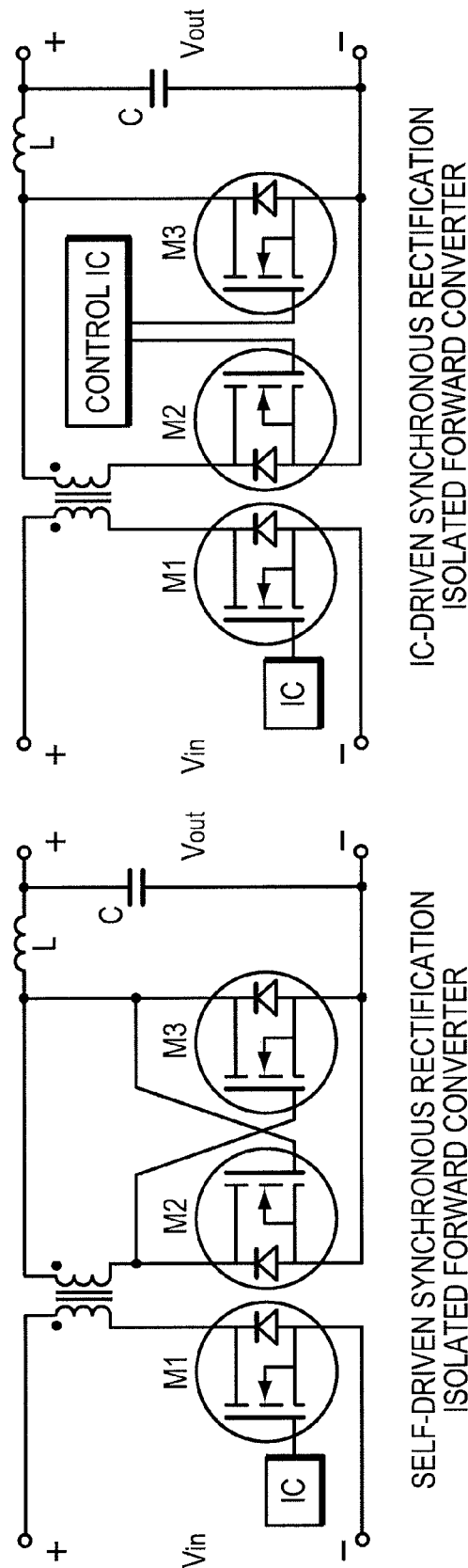
FIG. 1 depicts one aspect of the prior art in accordance with the teachings presented herein.
Figure 2:
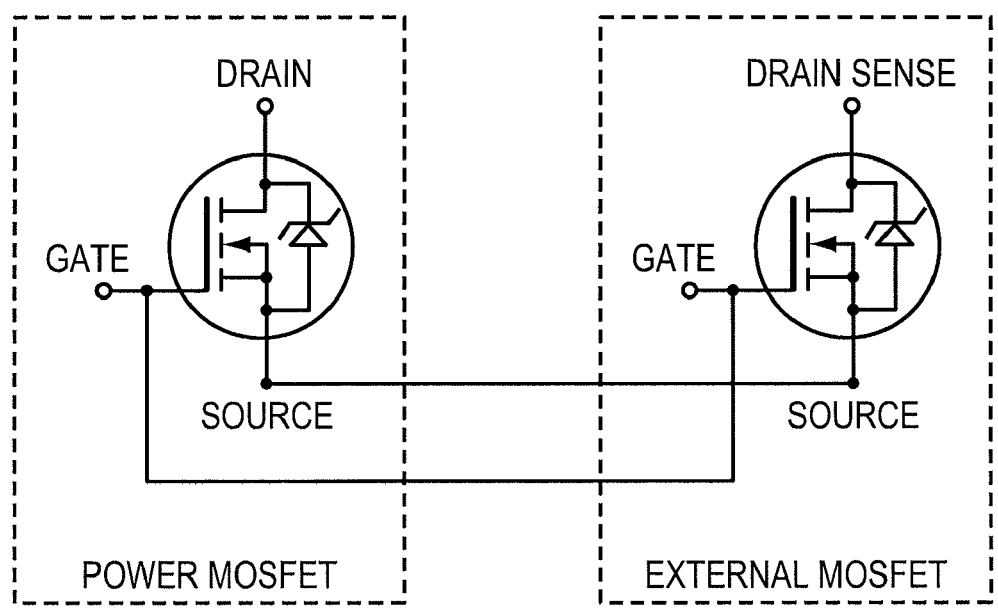
FIG. 2 depicts a second aspect of the prior art in accordance with the teachings presented herein.
Figures 3A, 3B:
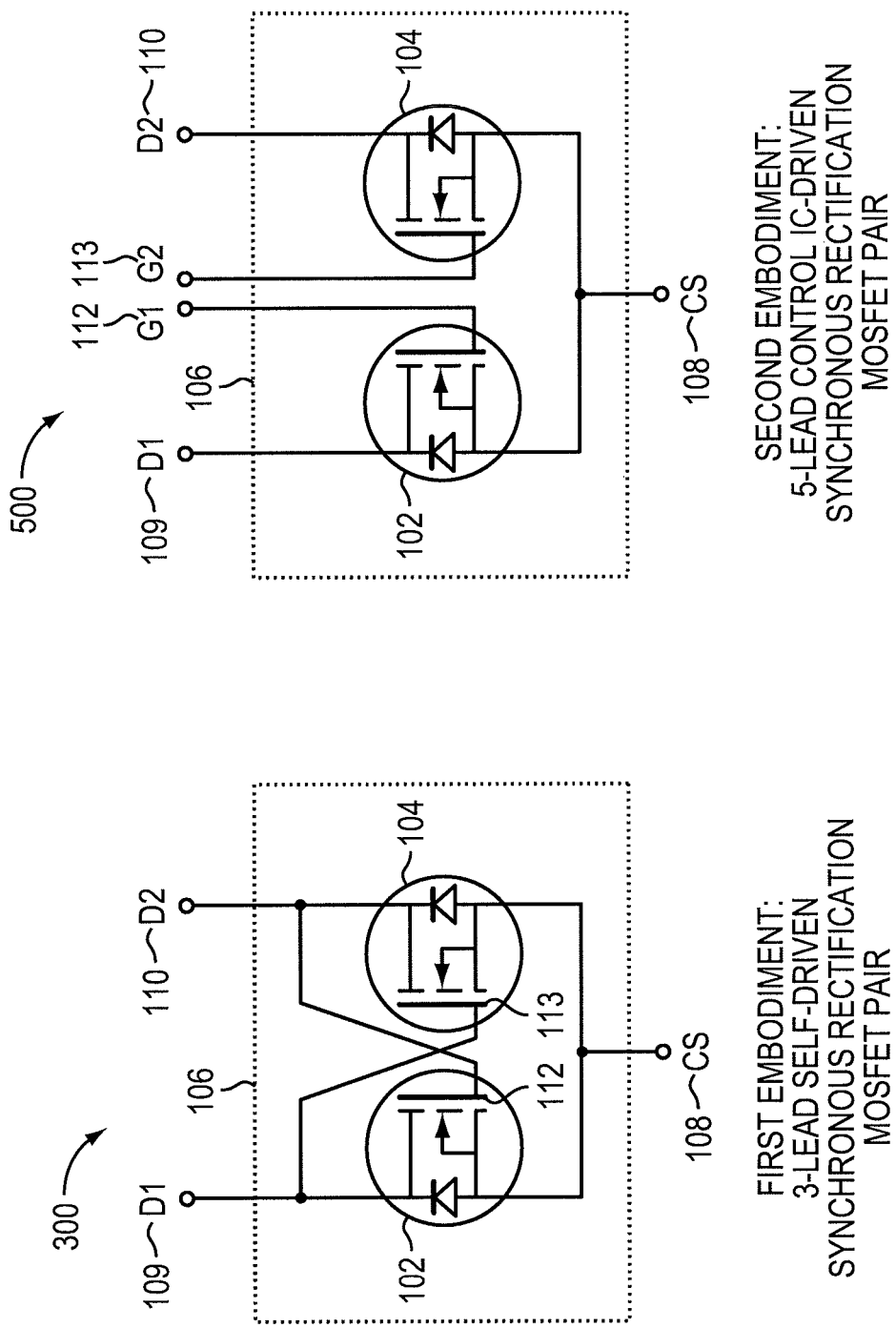
FIG. 3 depicts an aspect of the present invention in accordance with the teachings presented herein.

FIG. 3A is a schematic diagram of an exemplary embodiment of a monolithic semiconductor structure 300 constructed in accordance with the present invention that is suitable for use as a self-driven synchronous rectifier. The monolithic structure 300 has three leads and comprises a pair of lateral power MOSFETs 102 and 104, which are combined on a single semiconductor substrate 106. The monolithic structure 300 has three leads—common source terminal (CS) 108 and two electrically isolated drain terminals (D1 & D2) 109 and 110. The gate terminals (not shown) are connected internally.

The source terminal of the MOSFET 102 is connected to the source terminal of the MOSFET 104 to function as the common source terminal (CS) 108 of the structure 300. The drain terminal of the MOSFET 102 functions as the isolated drain terminal (D1) 109 of the structure 300 and is also connected to the gate terminal 113 of the MOSFET 104. The drain terminal of the MOSFET 104 functions as the isolated drain terminal (D2) 110 of the structure 300 and is also is connected to the gate terminal 112 of the MOSFET 102.

FIG. 3B is a schematic diagram of an exemplary embodiment of a monolithic semiconductor structure 500 constructed in accordance with the present invention that is suitable for use as an external-driven synchronous rectifier. The monolithic structure 500 has five leads and comprises a pair of lateral power MOSFETs 102 and 104, which are combined on a single semiconductor substrate 106. The monolithic structure 500 has five leads—common source terminal (CS) 108, two electrically isolated drain terminals (D1 & D2) 109 and 110 and two electrically isolated gate terminals (G1 & G2) 112 and 113.

The source terminal of the MOSFET 102 is connected to the source terminal of the MOSFET 104 to function as the common source terminal (CS) 108 of the structure 500. The drain terminal of the MOSFET 102 functions as the isolated drain terminal (D1) 109 of the structure 500 and the drain terminal of the MOSFET 104 functions as the isolated drain terminal (D2) 110 of the structure 500. The gate terminal of the MOSFET 102 functions as the isolated gate terminal (G1) 112 of the structure 500 and the gate terminal of the MOSFET 104 functions as the isolated drain terminal (G2) 113 of the structure 500.

FIG. 4

Figure 4A:
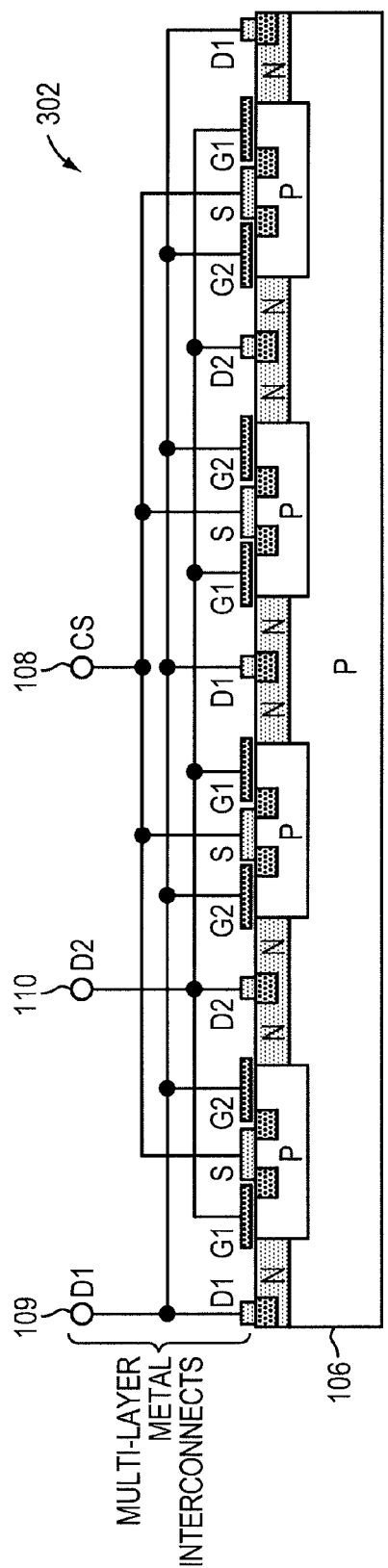
FIG. 4 depicts a second aspect of the present invention in accordance with the teachings presented herein.

FIG. 4A is an exemplary, physical cross-sectional diagram of a monolithic structure 302, which implements the schematic shown in FIG. 3A. FIG. 4A also depicts a schematic diagram of the leads interconnecting the drain and source terminals of the structure 302. The gate terminals (not shown) are connected internally. The monolithic structure 302 shows four pairs of lateral power MOSFETs (eight individual MOSFETs), which are combined on the semiconductor substrate 106. The underlying transistors of the eight lateral power MOSFETs are interleaved to create the alternating D1-D2 pattern shown in FIG. 4A. The monolithic structure 302 has three leads—common source CS and isolated drains, D1 and D2.

Figure 4B:
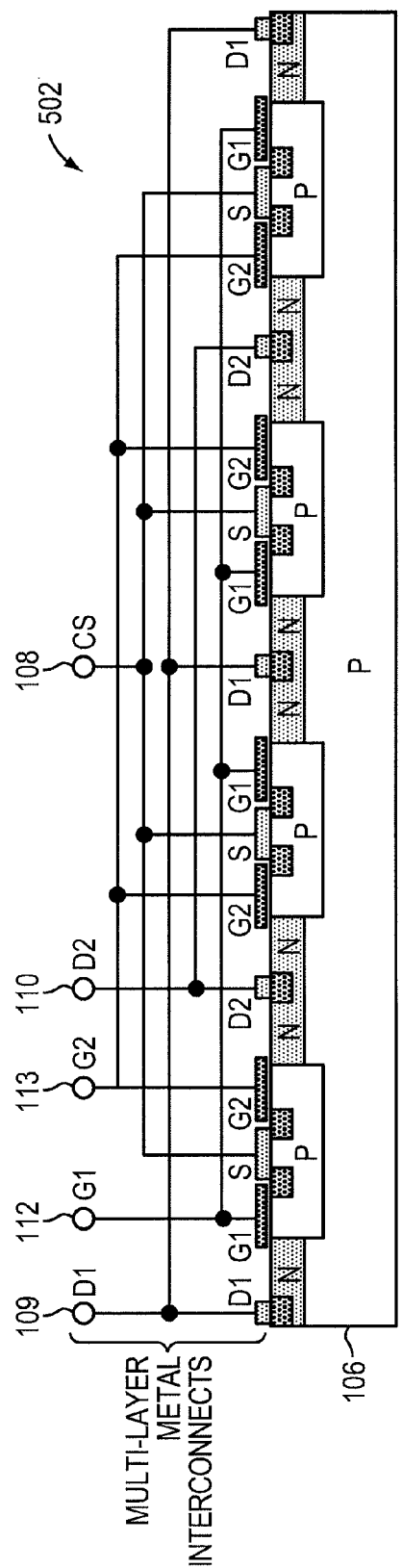

FIG. 4B is an exemplary, physical cross-sectional diagram of a monolithic structure 502, which implements the schematic shown in FIG. 3B. FIG. 4B also illustrates a schematic diagram of the leads interconnecting the drain, source and gate terminals of the structure 502. The Monolithic structure 502 shows four pairs of lateral power MOSFETs (eight individual MOSFETs), which are combined on the semiconductor substrate 106. The underlying transistors of the eight lateral power MOSFETs are interleaved to create the alternating pattern shown in FIG. 4B. The monolithic structure 502 has five leads, common source CS, isolated drains, D1 and D2 and isolated gate terminals G1 & G2.

FIG. 5

Figure 5A:
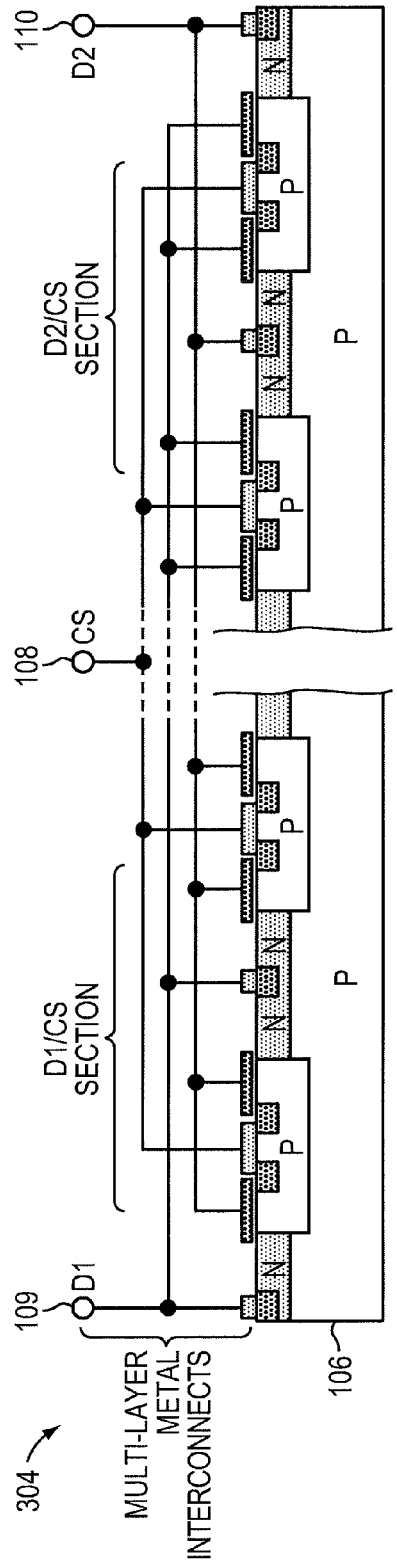
FIG. 5 depicts a third aspect of the present invention in accordance with the teachings presented herein.

FIG. 5A is an exemplary, physical cross-sectional diagram of an alternative monolithic structure 304, which implements the schematic shown in FIG. 3A. FIG. 5A also depicts a schematic diagram of the leads interconnecting the drain and source terminals of the structure 304. The gate terminals (not shown) are connected internally. As shown, the monolithic structure 304 has four pairs of lateral power MOSFETs (eight individual MOSFETs), which are combined on a single semiconductor substrate 106 having two separate cell sections: D1/CS section and D2/CS section. Each of the cell sections D1/CS and D2/CS includes two pairs of MOSFETs. The underlying transistors of the MOSFETs are connected in parallel to create the pattern shown in FIG. 5A. The monolithic structure 304 has three leads—common source CS and isolated drains, D1 and D2.

Figure 5B:
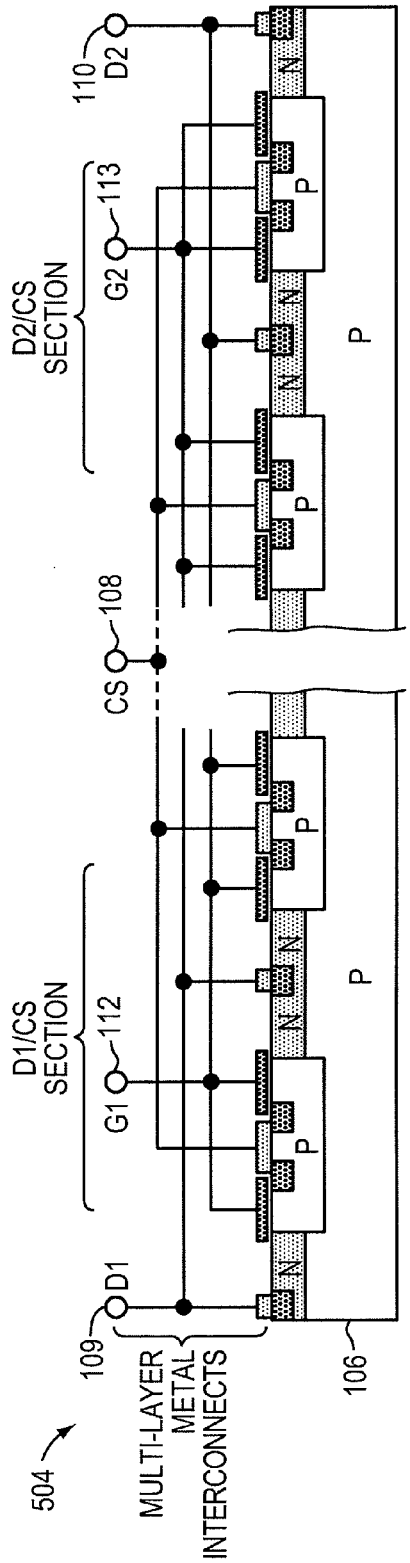

FIG. 5B is an exemplary, physical cross-sectional diagram of an alternative monolithic structure 504, which implements the schematic shown in FIG. 3B. FIG. 5B also depicts a schematic diagram of the leads interconnecting the drain and source terminals of the structure 504. As shown, the monolithic structure 504 has four pairs of lateral power MOSFETs (eight individual MOSFETs), which are combined on a single semiconductor substrate 106 having two separate cell sections: D1/CS and D2/CS. Each of the cell sections, D1/CS and D2/CS, includes two pairs of MOSFETs. The underlying transistors of the MOSFETs are connected in parallel to create the pattern shown in FIG. 5B. The monolithic structure 504 has five leads—common source CS, isolated drains, D1 and D2 and isolated gate terminals G1 & G2.

Monolithic Structures Having an Integrated Drain Sense

Figure 6:
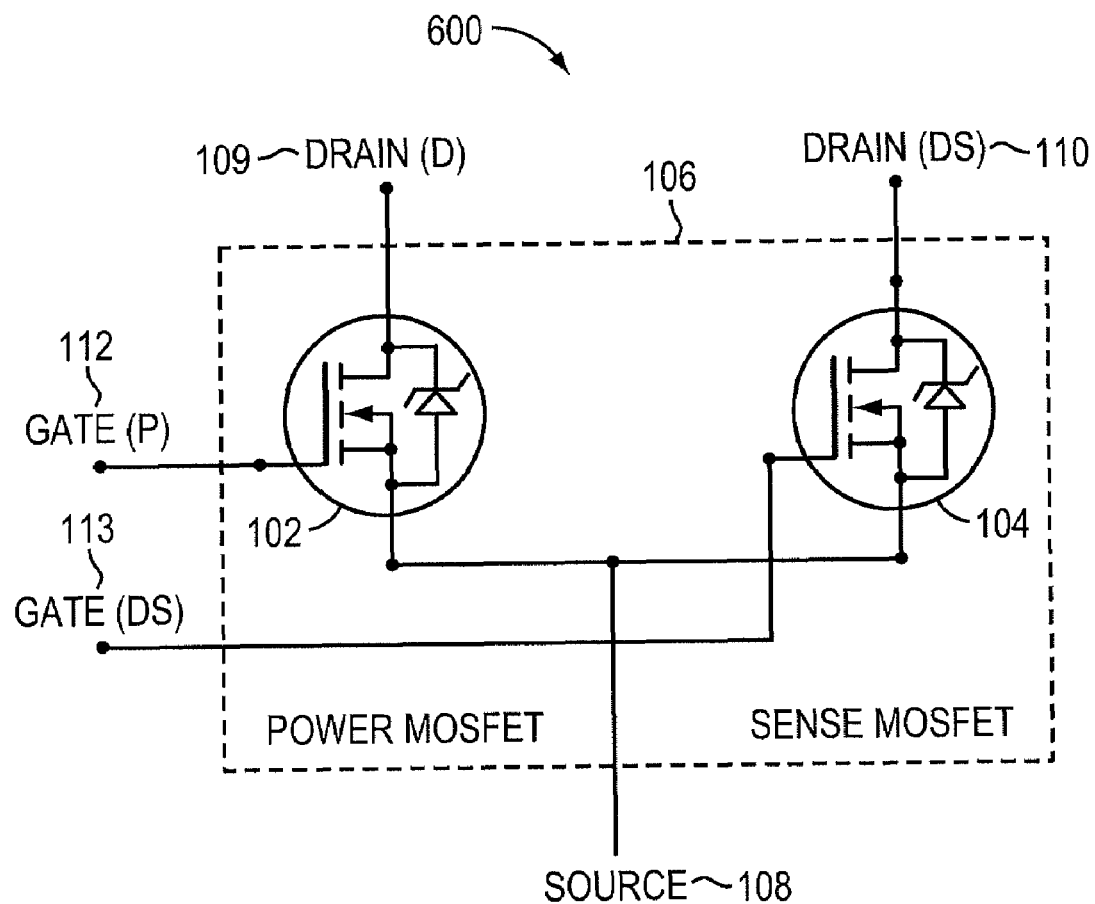
FIG. 6 depicts a fourth aspect of the present invention in accordance with the teachings presented herein.

FIG. 6 is a schematic diagram of an exemplary embodiment of a monolithic structure 600 having an integrated drain sense that is constructed in accordance with the present invention. The structure 600 comprises a first two lateral power MOSFET 102 combined with a second lateral power MOSFET 104 on a single semiconductor substrate 106. Preferably, the MOSFETs 102 and 104 have substantially similar voltage ratings and MOSFET 104 is smaller in size than MOSFET 102. The first power MOSFET 102 functions as a power transistor and the second power MOSFET 104 functions as a sense transistor to monitor the operating conditions of the first power MOSFET 102. In one embodiment, the size of sense MOSFET 104 is substantially smaller than the size of main MOSFET 102. In another embodiment, the sense MOSFET 104 is $1/10^{th}$ the size of the main MOSFET 102. The structure 600 has five leads and includes a common source terminal 108, two electrically isolated drain terminals 109 and 110 and two electrically isolated gate terminals 112 and 113.

The source terminal of the power MOSFET 102 is connected to the source terminal of the sense MOSFET 104 to function as the common source terminal 108 of the structure 600. The drain terminal of the power MOSFET 102 functions as the isolated drain terminal 109 of the structure 600. The drain terminal of the sense MOSFET 104 functions as the isolated drain terminal 110 of the structure 600. The gate terminal of the power MOSFET 102 functions as the isolated gate terminal 112 of the structure 600. The gate terminal of the sense MOSFET 104 functions as the isolated gate terminal 113 of the structure 600.

Figure 7:
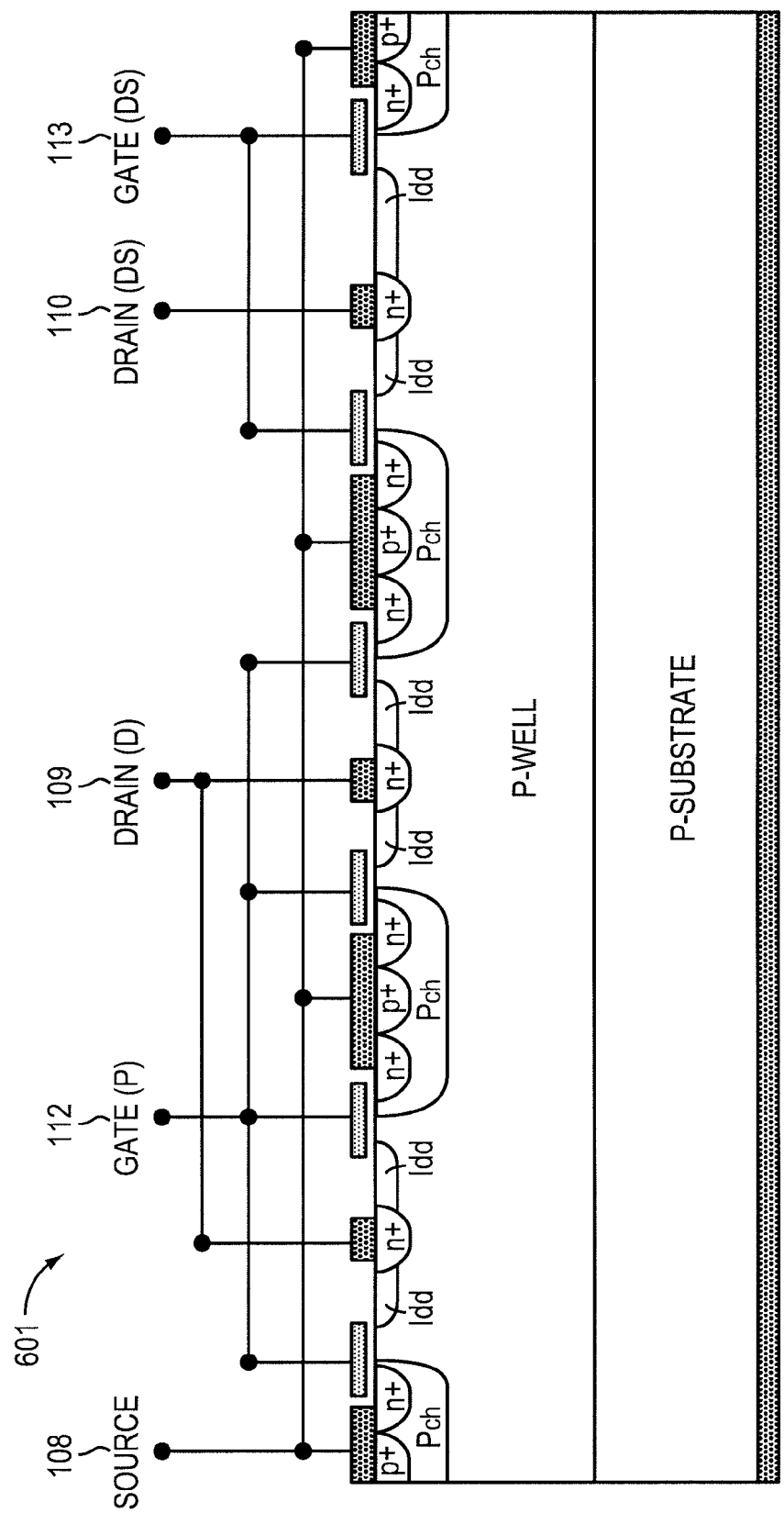
FIG. 7 depicts a fifth aspect of the present invention in accordance with the teachings presented herein.

FIG. 7 is an exemplary, physical cross-sectional diagram of a monolithic structure 601, which implements the schematic shown in FIG. 6.

Figure 8:
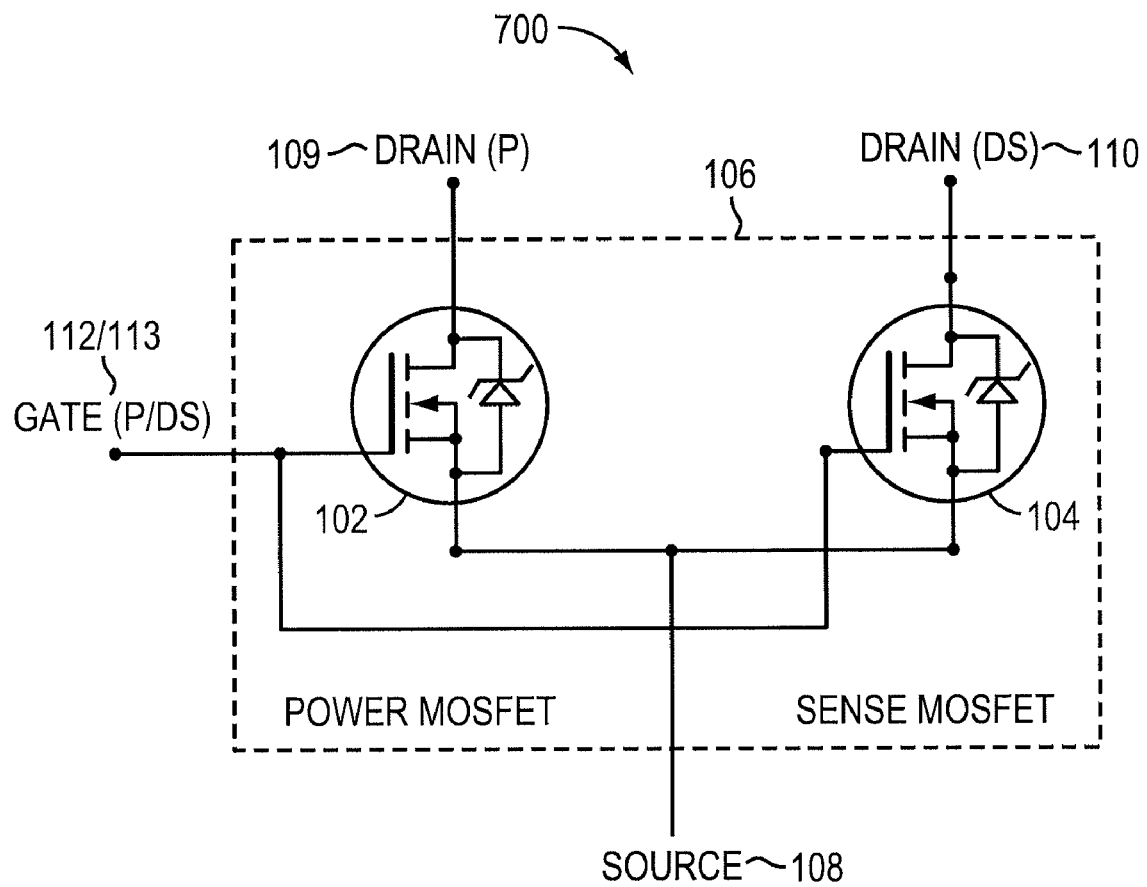
FIG. 8 depicts a sixth aspect of the present invention in accordance with the teachings presented herein.

FIG. 8 is a schematic diagram of an alternative embodiment of a monolithic structure 700 having an integrated drain sense that is constructed in accordance with the present invention. The structure 700 comprises at least two lateral power MOSFETs 102 and 104 of preferably equal voltage ratings which are combined on a single semiconductor substrate 106. The first power MOSFET 102 functions as a power transistor and the second power MOSFET 104 functions as a sense transistor to monitor the operating conditions of the first power MOSFET 102. The structure 700 has four leads and includes a common source terminal 108, two electrically isolated drain terminals 109 and 110 and a common gate terminal 112/113.

The source terminal of the power MOSFET 102 is connected to the source terminal of the sense MOSFET 104 to function as the common source terminal 108 of the structure 700. The drain terminal of the power MOSFET 102 functions as the isolated drain terminal 109 of the structure 700. The drain terminal of the sense MOSFET 104 functions as the isolated drain terminal 110 of the structure 700. The gate terminal of the power MOSFET 102 is connected to the gate terminal of the sense MOSFET 104 to function as the common gate terminal 112/113 of the structure 700.

Figure 9:
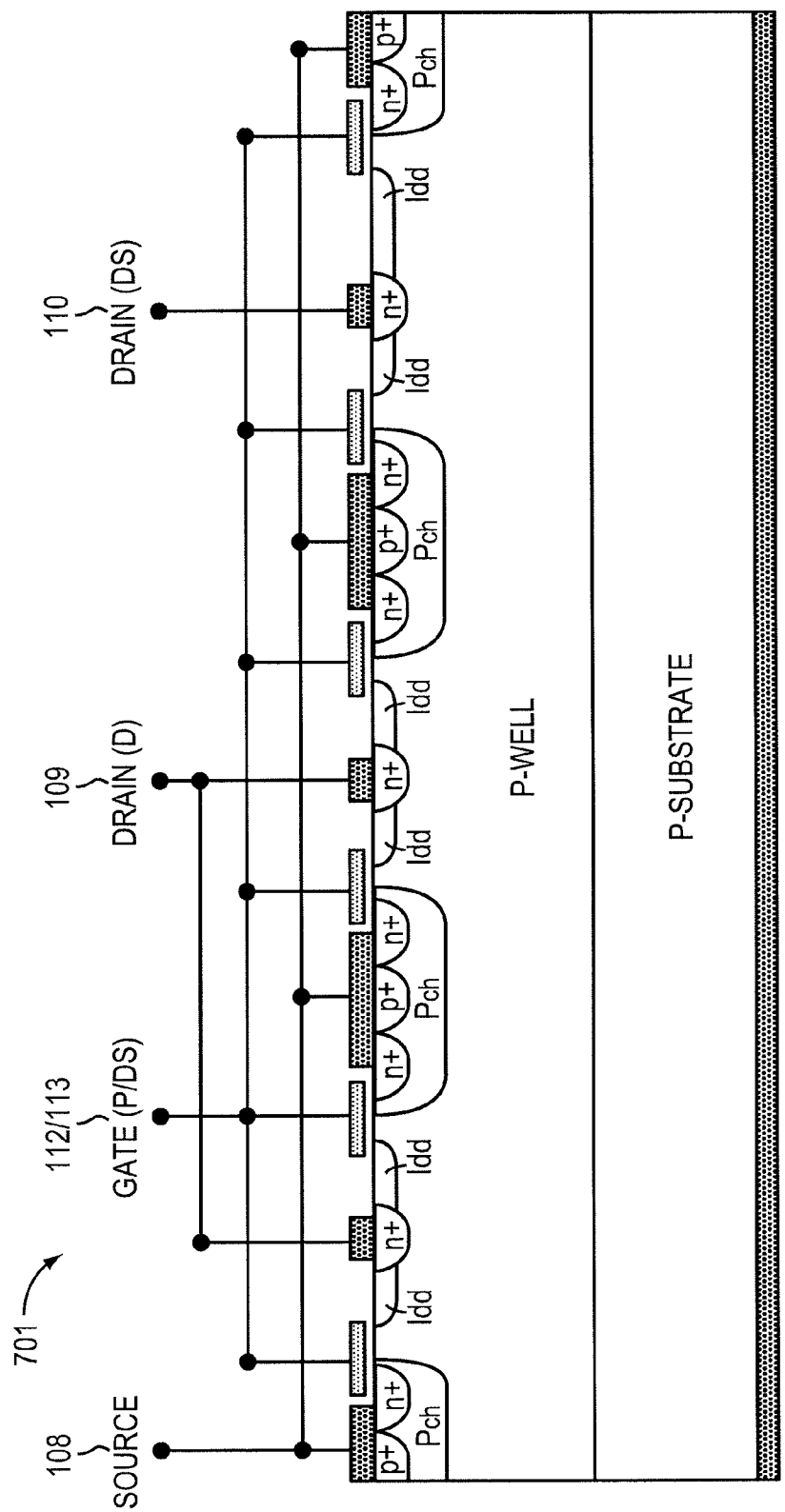
FIG. 9 depicts a seventh aspect of the present invention in accordance with the teachings presented herein.

FIG. 9 is an exemplary, physical cross-sectional diagram of a monolithic structure 701, which implements the schematic shown in FIG. 8.

Figure 10:
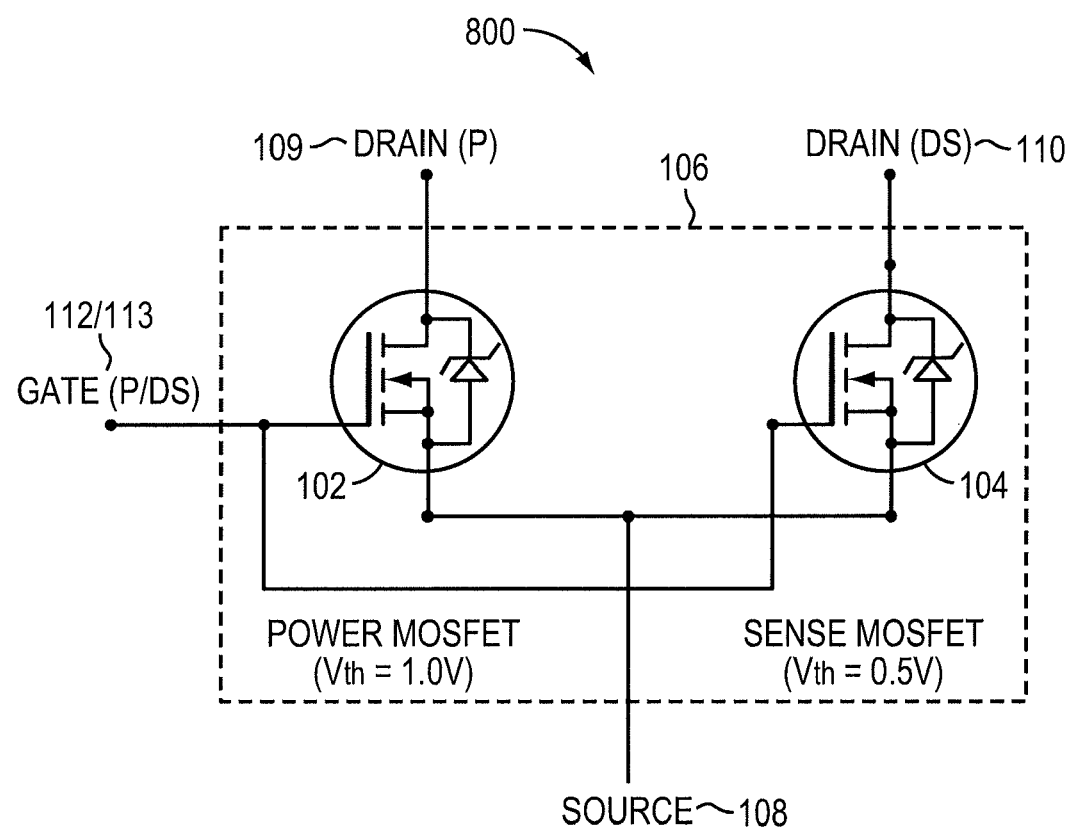
FIG. 10 depicts an eighth aspect of the present invention in accordance with the teachings presented herein.

FIG. 10 is a schematic diagram of another alternative embodiment of a monolithic structure 800 having an integrated drain sense that is constructed in accordance with the present invention. The structure 800 comprises at least two lateral power MOSFETs 102 and 104, each having substantially different threshold voltages, which are combined on a single semiconductor substrate 106. The first power MOSFET 102 has a threshold voltage rating of 1.0V and functions as a power transistor. The second power MOSFET 104 has a threshold voltage rating of 0.5V and functions as a sense transistor to monitor the operating conditions of the power MOSFET 102. The MOSFET structure 800 has four leads and includes a common source terminal 108, two electrically isolated drain terminals 109 and 110 and a common gate terminal 112/113.

The source terminal of the power MOSFET 102 is connected to the source terminal of the sense MOSFET 104 to function as the common source terminal 108 of the structure 800. The drain terminal of the power MOSFET 102 functions as the isolated drain terminal 109 of the structure 100. The drain terminal of the sense MOSFET 104 functions as the isolated drain terminal 110 of the structure 800. The gate terminal of the power MOSFET 102 is connected to the gate terminal of the sense MOSFET 104 to function as the common gate terminal 112/113 of the structure 800.

Figure 11:
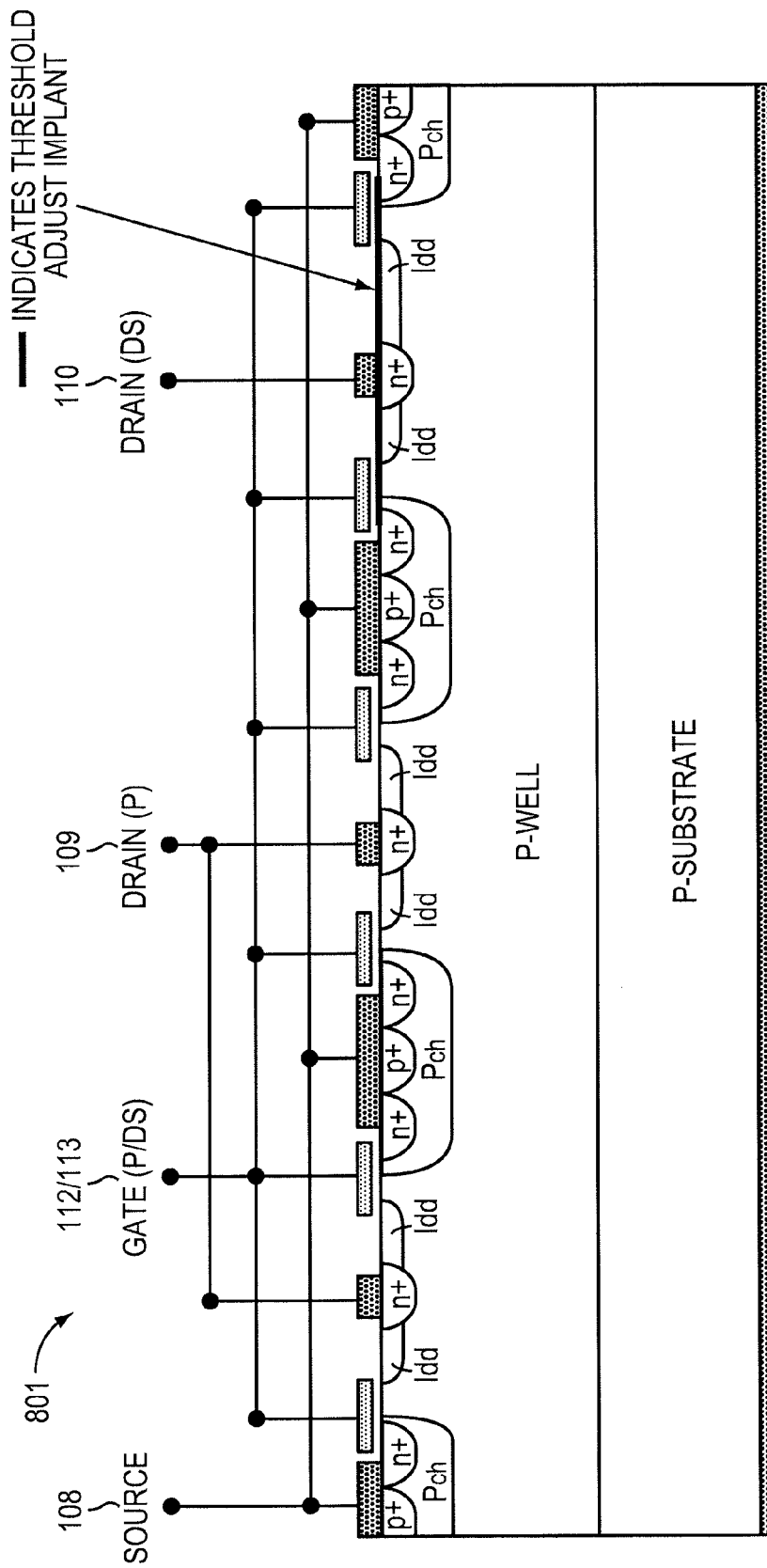
FIG. 11 depicts a ninth aspect of the present invention in accordance with the teachings presented herein.

FIG. 11 is an exemplary, physical cross-sectional diagram cross-sectional diagram of a monolithic structure 801, which implements the schematic shown in FIG. 10. Optionally, structure 801 includes an threshold adjust implant.

ADVANTAGES

The monolithic structures of the present invention provide several advantages over the prior art. First, the monolithic structures have a lower gate charge and gate resistance, similar on-resistance, less interconnect parasitics, and faster transition between the catch and forward MOSFETs than the prior art discrete circuit implementation. Second, the monolithic structures replace the two secondary-side synchronous catch and forward MOSFETs and a separate external MOSFET, thus reducing the number of device parts. Third, the monolithic structures have a small footprint, low profile, low interconnect impedance and junction-side cooling capability. Fourth, the the monolithic structures provide improved parametric matching of both the power and sense transistors. Fifth, main and sense MOSFETs relative sizes can be accurately established thus allowing the area dependent parameters of the monolithic structure's combined (main) and sense MOSFETs to be accurately ratioed. Sixth, the monolithic structures feature excellent temperature tracking for improved matching and accuracy. Seventh, the threshold voltages of the combined switch and sense MOSFETs of the monolithic structures can be adjusted independently for use in applications where this would be advantageous.

CONCLUSION

Having now described preferred embodiments of the invention, it should be apparent to those skilled in the art that the foregoing is illustrative only and not limiting, having been presented by way of example only. All the features disclosed in this specification (including any accompanying claims, abstract, and drawings) may be replaced by alternative features serving the same purpose, and equivalents or similar purpose, unless expressly stated otherwise. Therefore, numerous other embodiments of the modifications thereof are contemplated as falling within the scope of the present invention as defined by the appended claims and equivalents thereto.

What is claimed is:

1. A monolithic structure comprising:
   a first pair of devices and a second pair of devices, each pair of devices comprising:
   a first lateral device having a first source terminal, a first drain terminal, and a first gate terminal, each of said first source, first drain, and first gate terminals terminating on a first surface of a semiconductor substrate, and
   a second lateral device having a second source terminal, a second drain terminal and a second gate terminal, each of said second source, second drain, and second gate terminals terminating on said first surface of the semiconductor substrate, and
   a multi-layer metal interconnect structure disposed above each pair of devices,
   wherein (i) in each pair of devices, said first drain terminal is connected to said second drain terminal via the multi-layer metal interconnect structure, and said first gate terminal is connected to said second gate terminal via the multi-layer metal interconnect structure, (ii) in each pair of devices, each first lateral device is combined with each second lateral device on said substrate, (iii) both first source terminals are connected to both second source terminals to define a common source terminal disposed in the multi-layer metal interconnect structure of the monolithic structure, (iv) the multi-layer metal interconnect structure includes a first electrically isolated lead comprising the common source terminal, (v) said first and second drain terminals of the first pair of devices are electrically independent of the first and second drain terminals of the second pair of devices, and (vi) said first and second gate terminals of the first pair of devices are connected to said first and second drain terminals of the second pair of devices via the multi-layer metal interconnect structure and said first and second gate terminals of the second pair of devices are connected to said first and second drain terminals of the first pair of devices via the multi-layer metal interconnect structure.

2. A monolithic structure comprising at least four lateral power transistor devices combined on a semiconductor substrate, said monolithic structure comprising:
   a first pair of power transistor devices and a second pair of power transistor devices, each pair of power transistor devices comprising:
   a first lateral power transistor device comprising a first source terminal, a first drain terminal and a first gate terminal, each of said first source, first drain, and first gate terminals terminating on a first surface of the semiconductor substrate, and
   a second lateral power transistor device comprising a second source terminal, a second drain terminal, and a second gate terminal, each of said second source, second drain, and second gate terminals terminating on said first surface of the semiconductor substrate, and
   a multi-layer metal interconnect structure disposed above each pair of devices,
   wherein (i) in each pair of devices, said first drain terminal is connected to said second drain terminal via the multi-layer metal interconnect structure, and said first gate terminal is connected to said second gate terminal via the multi-layer metal interconnect structure, (ii) said first and second gate terminals of the first pair of power transistor devices are connected to said first and second drain terminals of the second pair of power transistor devices via the multi-layer metal interconnect structure, (iii) said first and second gate terminals of the second pair of devices are connected to said first and second drain terminals of the first pair of power transistor devices via the multi-layer metal interconnect structure, (iv) said first and second drain terminals of the first pair of devices are electrically independent of the first and second drain terminals of the second pair of power transistor devices, (v) the multi-layer metal interconnect structure includes a first electrically isolated lead comprising both first source terminals-connected to both second source terminals, (vi) the multi-layer metal interconnect structure includes a second electrically isolated lead comprises said first and second drain terminals of the first pair of power transistor devices, and (vii) the multi-layer metal interconnect structure includes a third electrically isolated lead comprising said second drain terminals of the second pair of transistor devices.

3. The monolithic structure of claim 2 wherein each of said first and second lateral power transistor devices comprises a lateral power MOSFET.

4. A monolithic structure comprising at least four lateral power transistor devices combined on a semiconductor substrate, said structure comprising:
   a first pair of power transistor devices and a second pair of power transistor devices, each pair of power transistor devices comprising:
   a first lateral power transistor device comprising a first source terminal, a first drain terminal, and a first gate terminal, each of said first source, first drain, and first gate terminals terminating on a first surface of the semiconductor substrate, and
   a second lateral power transistor device comprising a second source terminal, a second drain terminal, and a second gate terminal, each of said second source, second drain, and second gate terminals terminating on said first surface, and
   a multi-layer metal interconnect structure disposed above each pair of devices,
   wherein in each pair of devices, said first drain terminal is connected to said second drain terminal via the multi-layer metal interconnect structure and said first gate terminal is connected to said second gate terminal via the multi-layer metal interconnect structure; and the multi-layer metal interconnect structure includes (i) a first electrically isolated lead comprising both first source terminals connected to both second source terminal, (ii) a second electrically isolated lead comprising said first and second drain terminals of the first pair of power transistor devices, (iii) a third electrically isolated lead comprising said first and second drain terminals of the second pair of power transistor devices, and (iv) a fourth electrically isolated lead comprising said first and second gate terminals of the first pair of power transistor devices connected to said first and second gate terminals of the second pair of power transistor devices.

5. The monolithic structure of claim 4 wherein each of said first and second lateral power transistor devices comprises a lateral power MOSFET.

6. The monolithic structure of claim 4 wherein a size of said second lateral power transistor is smaller than a size of said first lateral power transistor.

7. The monolithic structure of claim 4 wherein a first threshold voltage of said first lateral power transistor is different from a second threshold voltage of said second lateral power transistor and a difference in said first and second threshold voltages is at least approximately 0.1 V.

8. The monolithic structure of claim 2, wherein each of the first and second lateral devices comprise source and drain dopants of a same type.

9. The monolithic structure of claim 4, wherein each of the first and second lateral devices comprise source and drain dopants of a same type.

* * * * *